US010726191B2

(12) United States Patent
Huang et al.

(10) Patent No.: US 10,726,191 B2
(45) Date of Patent: Jul. 28, 2020

(54) METHOD AND SYSTEM FOR MANUFACTURING A SEMICONDUCTOR DEVICE

(71) Applicant: TAIWAN SEMICONDUCTOR MANUFACTURING COMPANY LTD., Hsinchu (TW)

(72) Inventors: Hsuan-Ming Huang, Hsinchu (TW); An Shun Teng, Hsinchu (TW); Mingni Chang, Hsinchu (TW); Ming-Yih Wang, Hsin-Chu (TW); Yinlung Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/245,975

(22) Filed: Jan. 11, 2019

(65) Prior Publication Data

US 2020/0104456 A1 Apr. 2, 2020

Related U.S. Application Data

(60) Provisional application No. 62/738,576, filed on Sep. 28, 2018.

(51) Int. Cl.
*G06F 30/30* (2020.01)
*H01L 23/522* (2006.01)
*G06F 30/398* (2020.01)
*H01L 49/02* (2006.01)

(52) U.S. Cl.
CPC ........ *G06F 30/398* (2020.01); *H01L 23/5223* (2013.01); *H01L 23/5226* (2013.01); *H01L 28/60* (2013.01)

(58) Field of Classification Search
CPC .............. G06F 30/398; H01L 23/5223; H01L 23/5226
USPC ................................... 716/54, 100, 110, 132
See application file for complete search history.

(56) References Cited

U.S. PATENT DOCUMENTS

| 6,023,438 A * | 2/2000 | Tanaka et al. .......... G11C 11/22 365/207 |
| 6,894,520 B2 * | 5/2005 | Yamashita et al. .. G01R 31/275 324/750.3 |
| 6,982,454 B2 * | 1/2006 | Giuroiu et al. ..... H01L 23/5223 257/306 |
| 7,732,889 B2 * | 6/2010 | Crawley et al. .... H01L 23/5223 257/307 |
| 8,022,458 B2 * | 9/2011 | Chang et al. ....... H01L 23/5223 257/306 |

(Continued)

*Primary Examiner* — Sun J Lin
(74) *Attorney, Agent, or Firm* — WPAT, P.C., Intellectual Property Attorneys; Anthony King

(57) ABSTRACT

The present disclosure provides a method for manufacturing a semiconductor device. The method includes receiving layout data representing mask information for manufacturing a semiconductive substrate with a conductor over the semiconductive substrate. A first capacitor is formed between the conductor and the semiconductive substrate. The method further includes determining a capacitance difference between capacitances of the first capacitor and a neighboring capacitor. The method further includes forming a dummy capacitor to minimize the capacitance difference. A system for manufacturing a semiconductor device is also provided.

20 Claims, 11 Drawing Sheets

(56) References Cited

U.S. PATENT DOCUMENTS

| | | | |
|---|---|---|---|
| 8,766,403 B2* | 7/2014 | Huang et al. | H01L 23/5223 |
| | | | 257/296 |
| 9,076,678 B2* | 7/2015 | Nishizaki et al. | H01L 23/5223 |
| 9,450,041 B2* | 9/2016 | Lin et al. | H01G 4/005 |
| 9,552,771 B2* | 1/2017 | Jeon et al. | G09G 3/3225 |
| 10,515,911 B2* | 12/2019 | Chun et al. | H01L 23/5223 |
| 2006/0114247 A1* | 6/2006 | Brown | G02F 1/13338 |
| | | | 345/204 |

* cited by examiner

METHOD AND SYSTEM FOR MANUFACTURING A SEMICONDUCTOR DEVICE

PRIORITY CLAIM AND CROSS-REFERENCE

This application claims the benefit of prior-filed provisional application No. 62/738,576, filed Sep. 28, 2018.

BACKGROUND

During a top layer etching operation or a plasma treatment operation in semiconductor fabrication processes, it has been observed that a difference in charging speeds of capacitors induces a delta voltage between two conductors, causing dielectric damage between conductors. The difference in charging speeds of capacitors results from an unbalanced capacitance-induced damage effect. It has also been observed that a larger capacitance differential between two capacitors correlates to a lower breakdown voltage of a gate dielectric (referred to as "Vbd tailing").

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
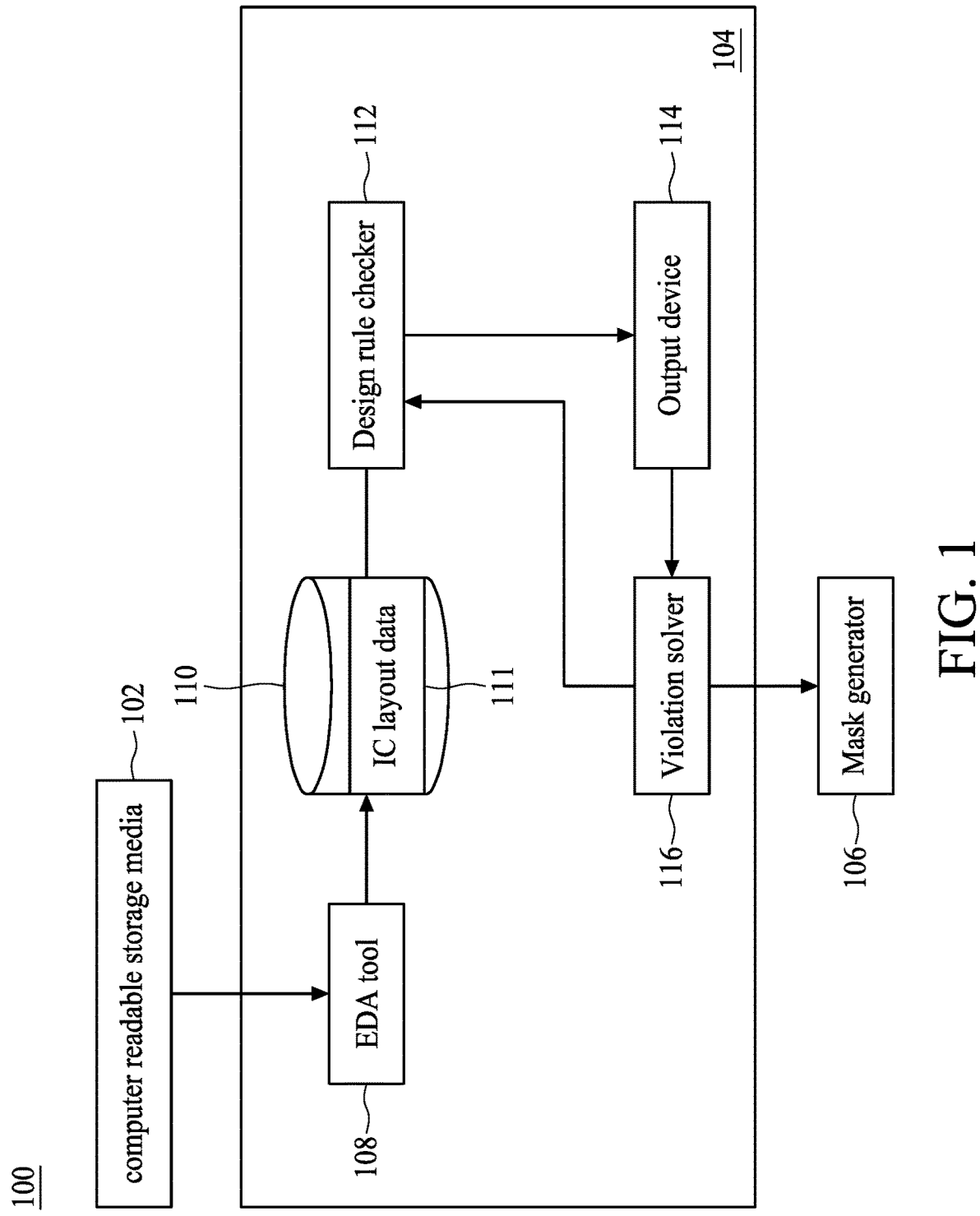
FIG. 1 is a block diagram of a system for manufacturing a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In a semiconductor device, two conductors separated by a dielectric medium inevitably form a parasitic capacitor. It is important to keep capacitances of the parasitic capacitors in a semiconductor device balanced. In other words, the differences between the capacitances of the parasitic capacitors should be kept within an acceptable range.

Furthermore, with the rising trend of downsizing of integrated circuits, the distance between the conductors is reduced, making the imbalance between capacitances significant. When the capacitances of the parasitic capacitors are unbalanced, the parasitic capacitors have different charging speeds, and may therefore cause dielectric damage between the conductors.

The capacitance of a capacitor is proportional to its area of overlap and the dielectric constant of the dielectric medium, and is inversely proportional to the thickness of the dielectric medium. As a result the capacitances may be adjusted through the dielectric constant of the dielectric medium, the thickness of the dielectric medium, and the area of overlap between the conductors. However, the above factors may be constrained by the technology used for forming the semiconductor device, and the range of adjustments to the specifications of the dielectric medium and the conductors are limited. As a result, the problem of unbalanced capacitances is difficult to prevent. Therefore, one aspect of the disclosure provides a method of forming a semiconductor device with a dummy capacitor in order to reduce or mitigate the problem of unbalanced capacitances. Another aspect of the disclosure pertains to a system for manufacturing a semiconductor device through the above method.

Referring to FIG. 1, FIG. 1 is a block diagram of a system 100 for manufacturing a semiconductor device, in accordance with some embodiments of the present disclosure. The system 100 includes a computer readable storage medium 102, a processor 104, and a mask generator 106.

The processor 104 is coupled to the computer readable storage medium and programmed for carrying out operations described below with reference to FIG. 2. In some embodiments, the processor 104 may be part of a special purpose computer for design rule checking configured to perform various methods as disclosed herein.

In some embodiments, the processor 104 includes electronic design automation (EDA) tool 108. In some embodiments, the EDA tool 108 includes EDA software such as "IC COMPILER"™, sold by Synopsis, Inc. of Mountain View, Calif., including a router such as "ZROUTE"™, also sold by Synopsis. In some embodiments, other EDA software may be used, such as the "VIRTUOSO" custom design platform or the Cadence "ENCOUNTER"® digital IC design platform may be used, along with the "VIRTUOSO" chip assembly router, all sold by Cadence Design Systems, Inc. of San Jose, Calif.

The EDA tool 108 is a special purpose computer formed by retrieving stored program instructions from the computer readable storage medium 102 and executing the instructions pertaining to the layout design on the processor 104.

In some embodiments, one or more computer readable storage media 102 are provided to store input data used by the EDA tool 108. In some embodiments, the input data may include program instructions and layout design rules. The layout design rules may include default rules applicable to all designs or rules specific to a particular kind of design or the instant design. In some embodiments, the storage medium 102 may include one or more of dynamic random access memory (RAM), SDRAM, a read only memory (ROM), EEPROM, a hard disk drive (HDD), an optical disk drive (CD-ROM, DVD-ROM or BD-ROM), a flash memory, or the like. The physical storage media for the program instructions and layout design rules may be the same or different media.

In some embodiments, the circuit designer inputs layout data representing information for manufacturing a semiconductive substrate in the EDA tool 108. In some embodiments, the information includes a set of photolithography masks for manufacturing the semiconductor device. In some embodiments, the information includes several patterns in several cells. The input layout data is often a product of one or more software programs that take an electronic design and convert it to a layout representing semiconductor features. An example of the software program is an electronic design compiler and router. In some embodiments, the circuit designer may electronically draw the layout data using the EDA tool 108.

In some embodiments, a computer readable storage medium 110 is provided with the EDA tool 108 for outputting an IC layout data 111. The storage medium 110 may be a separate storage device, or a portion of the same storage medium 102 described above. The storage medium 110 may be any of the types of storage media described above with respect to the storage medium 102.

In some embodiments, the IC layout data 111 is checked by the Design Rule Checker (DRC) software 112. The IC layout data 111 is outputted to any of various output devices 114 such as a printer, a screen, a graphic display device, or the like.

Design Rule Checker (DRC) software can systematically check design rules in a layout design. A circuit designer enters the necessary design rules, referred to as a deck, into the DRC using its design rule language, such as Standard Verification Rule Format (SVRF) or a software specific Tool Command Language (TCL). Commonly used DRC software includes Calibre by Mentor Graphics; Hercules by Synopsys; and Diva, Dracula, Assura, and PVS by Cadence Design Systems.

In some embodiments, the IC layout data 111 is used by a violation solver 116 that changes one or more of the parameters and represents the layout to the design rule checker 112. In some embodiments, the violation solver 116 is a circuit designer. In other embodiments, the violation solver 116 is a computer program, which may be a part of the EDA tool 108. In some embodiments, sufficient parameters are changed such that the design returns to the EDA tool 108 for re-routing and re-layout.

In some embodiments, once the design rule checker 112 clears the design of violations, the design is sent to a mask generator 106. The mask generator 106 generates the information necessary to physically form the photomasks. The mask information is sent to an entity that makes the photomasks for the semiconductor fabrication processes.

In some embodiments, the system 100 may further include an input device for entering the layout data and/or adjusting the layout data during one or more iterative resolutions of the layout. Using the system 100, a circuit designer may perform a process such as that of FIG. 2 in accordance with various embodiments of the present disclosure.

Figure 2:
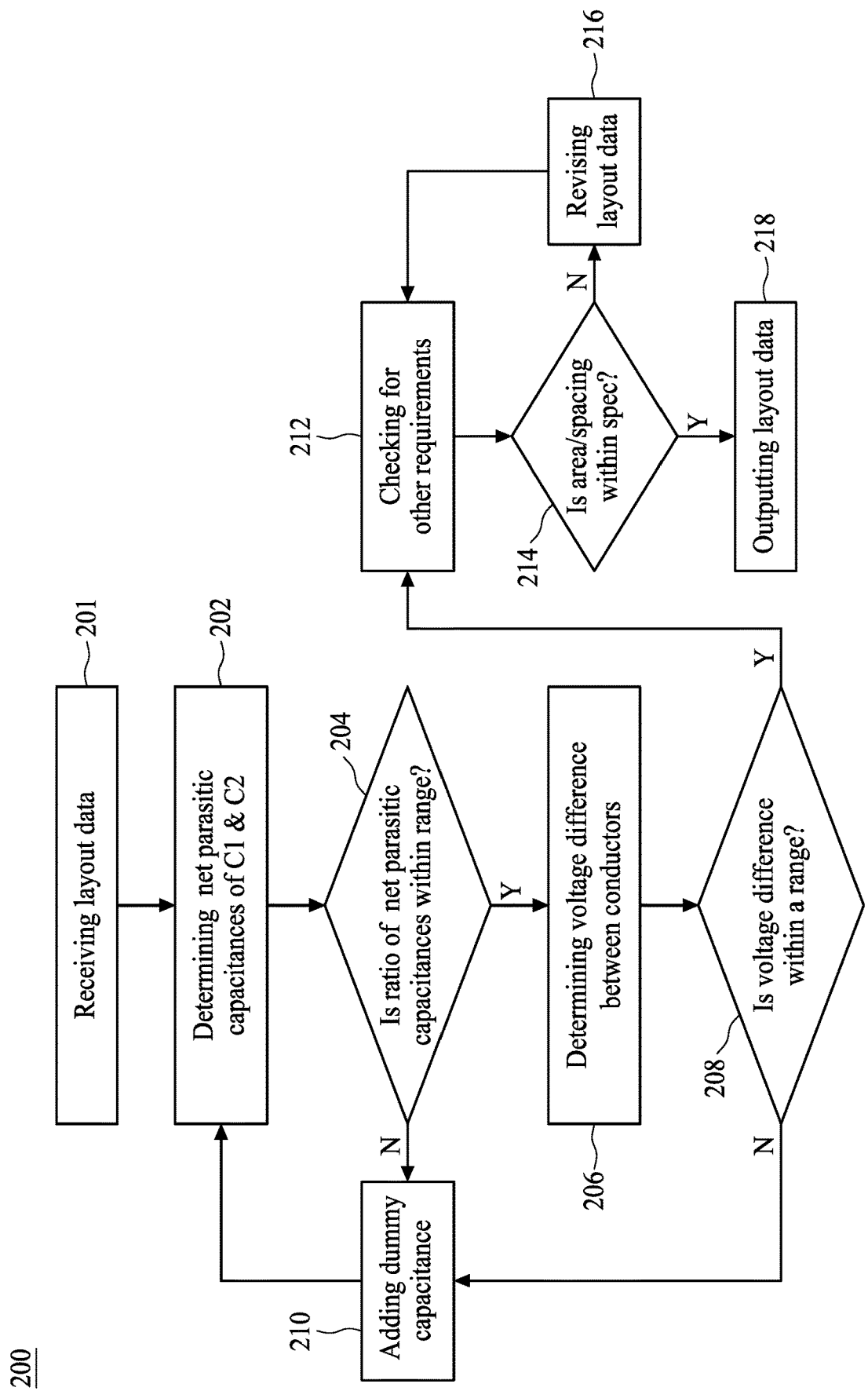
FIG. 2 is a flowchart of a method of forming a semiconductor device, in accordance with some embodiments of the present disclosure.
Figure 3:
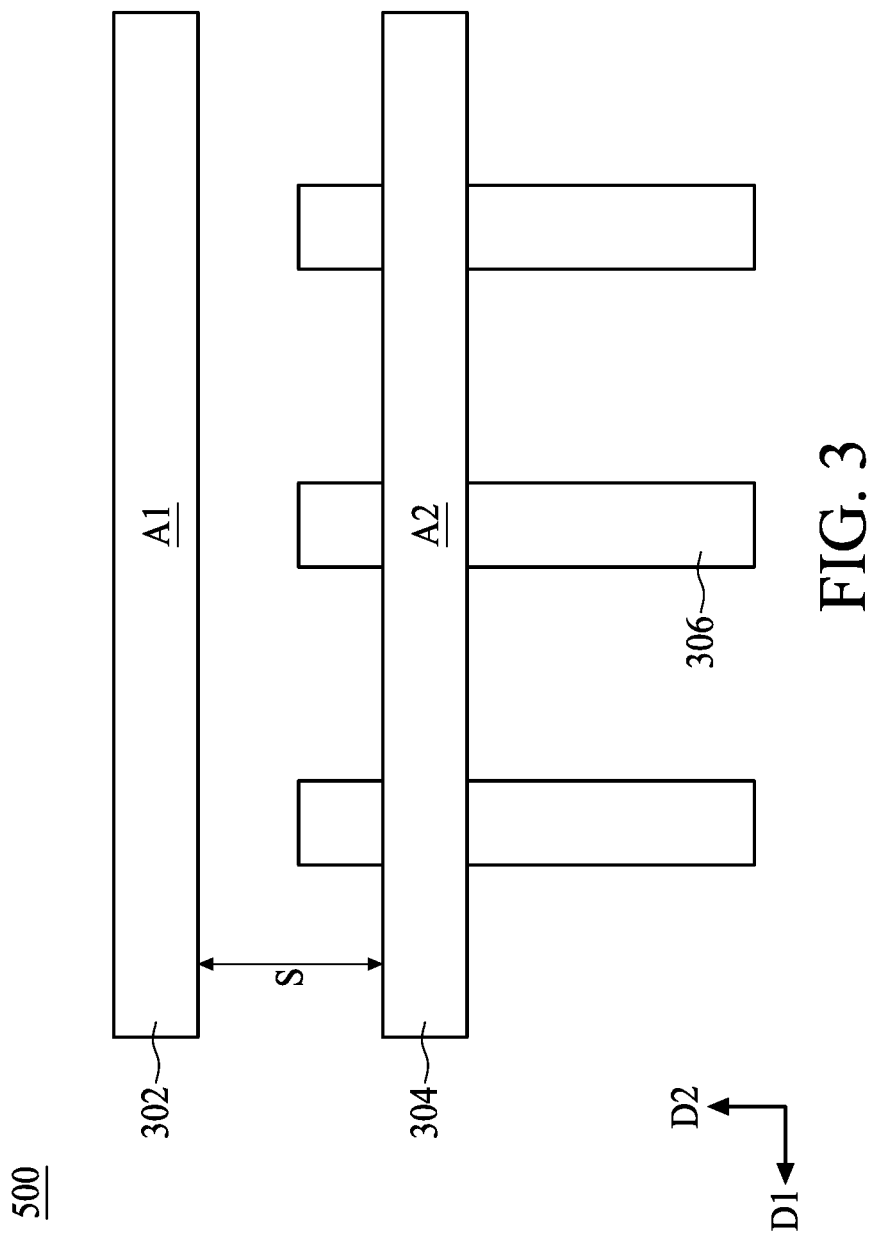
FIGS. 3 to 10 are top views and cross-sectional views of a semiconductor structure, in accordance with some embodiments of the present disclosure.

Referring to FIG. 2, FIG. 2 is a flowchart of a method 200 of forming a semiconductor device 500, in accordance with some embodiments of the present disclosure. The method 200 is described herein with reference to FIGS. 3 to 6. FIGS. 3 to 6 are top views and cross-sectional views of the semiconductor structure 500, respectively, in accordance with some embodiments of the present disclosure. It should be noted that the top views in FIGS. 3 and 5 are simplified for simplicity, and some elements in the cross-sectional views are not shown in FIGS. 3 and 5. In addition, throughout the various views and illustrative embodiments of the present disclosure, identical numbers represent similar components for simplicity of explanation.

The method 200 begins at operation 201, receiving the layout data representing the information for manufacturing the semiconductor structure 500. As mentioned above, the information may include a set of photolithography masks for manufacturing the semiconductor device.

Figure 4:
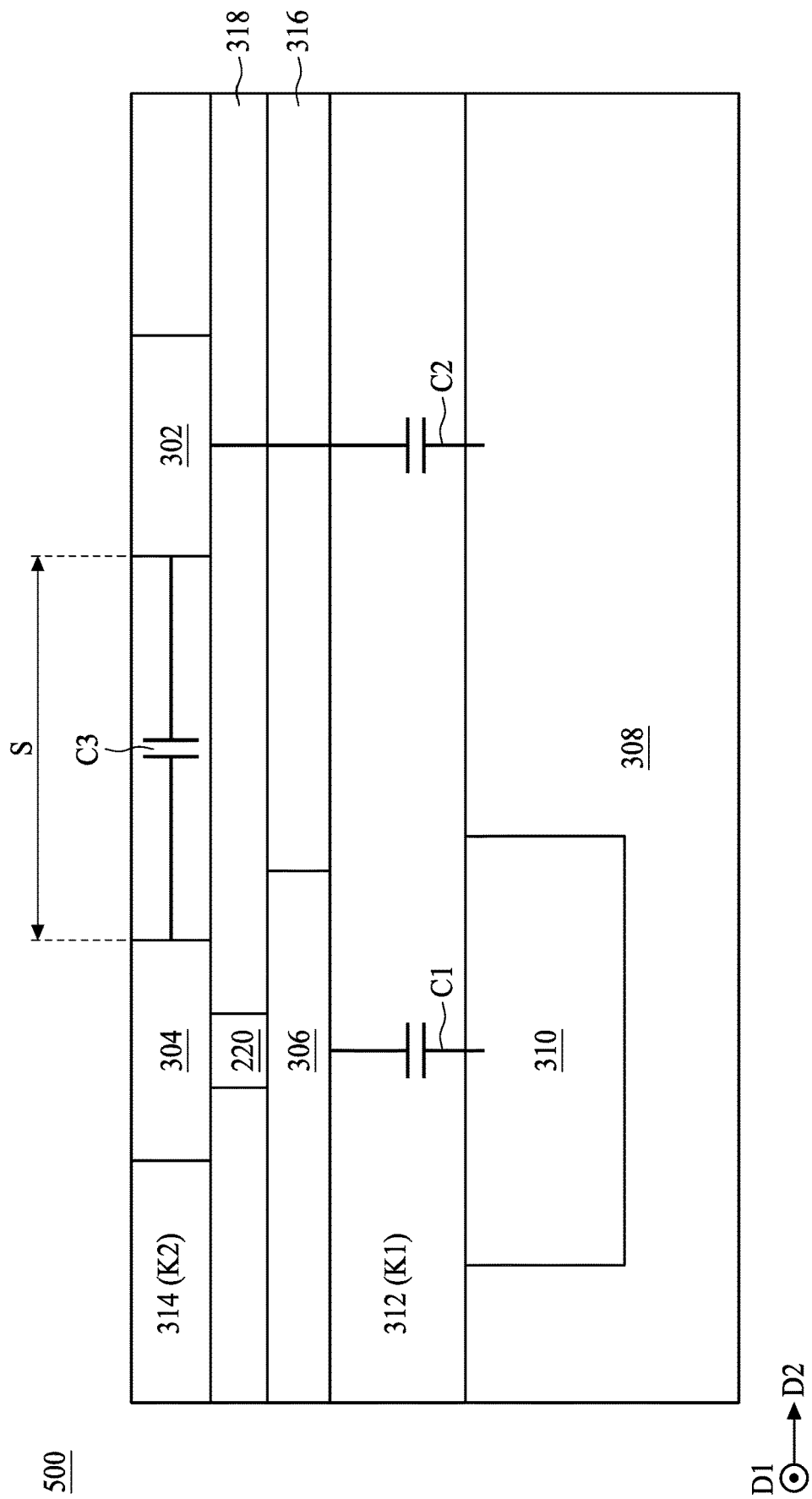
Figure 5:
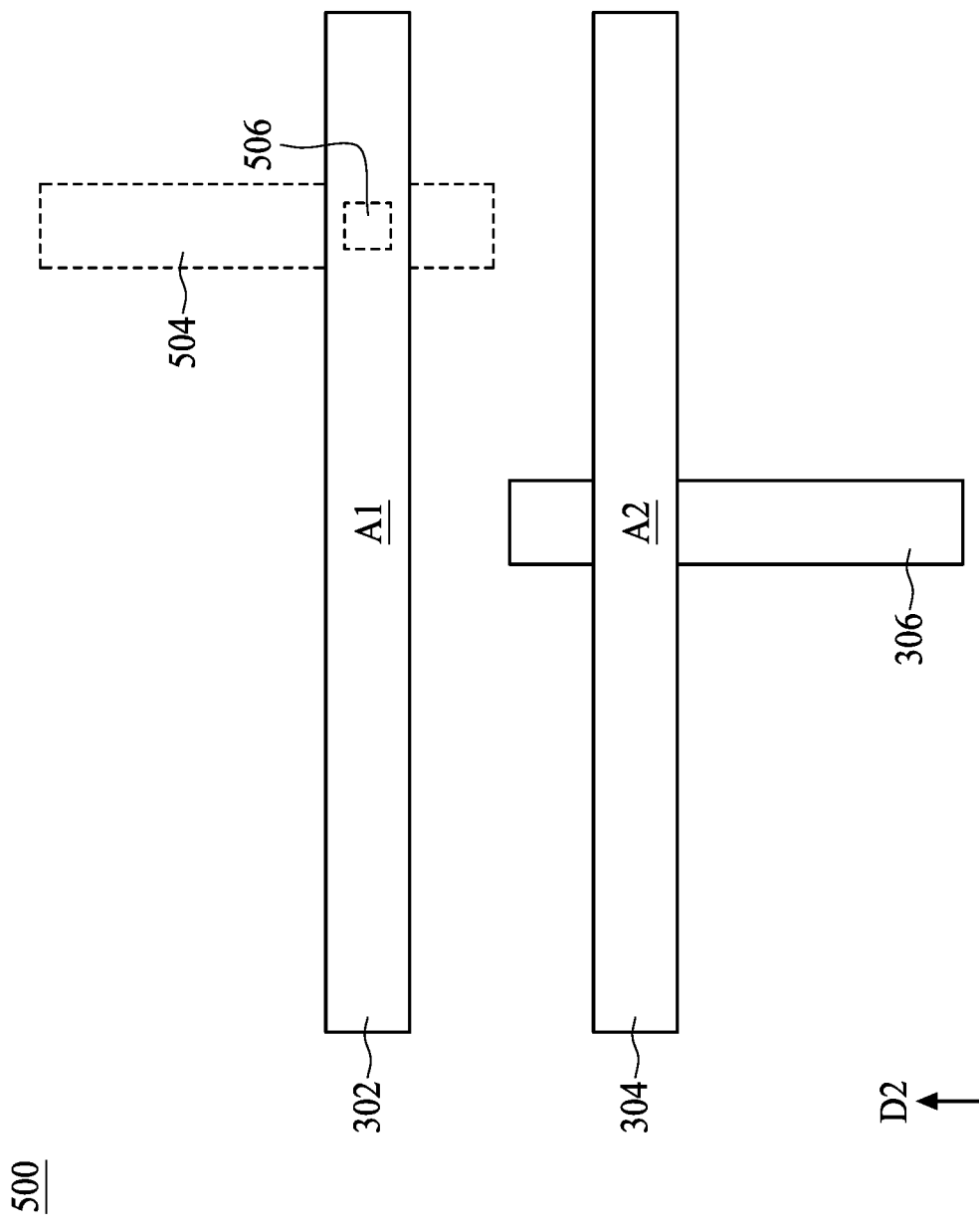

Referring to FIGS. 3 and 4, the semiconductor structure 500 includes a semiconductive substrate 308 with a conductor 304. In some embodiments, the semiconductor structure 500 further includes a first dielectric 312 between the semiconductive substrate 308 and the conductor 304, wherein the first dielectric 312 has a dielectric constant K1. The first dielectric 312, the semiconductive substrate 308 and the conductor 304 form a parasitic capacitor C1.

In some embodiments, the semiconductor structure 500 further includes a conductor 302 near the conductor 304. Due to the conductor 302, parasitic capacitors C2 and C3 are also introduced in the semiconductor structure 500.

In some embodiments, the semiconductive substrate 308 may include a silicon substrate, a silicon germanium substrate, or a substrate formed of other semiconductor materials. In some embodiments, the semiconductive substrate 308 may be doped with a p-type or an n-type impurity. In some embodiments, the conductors 302 and 304 may include a metallization layer, a metal trace, a doped polysilicon, or other conductive features.

In some embodiments, the semiconductor structure 500 further includes a second dielectric 314 formed on the semiconductive substrate 308. In some embodiments, the second dielectric 314 is in contact with and between the conductors 302 and 304, and the second dielectric 314 keeps the conductors 302 and 304 separate from each other.

In some embodiments, the first dielectric 312 with the dielectric constant K1 is between the second dielectric 314 and the semiconductive substrate 308. In some embodiments, the first dielectric 312 keeps the conductors 302 and 304 separate from the semiconductive substrate 308.

In some embodiments, the first dielectric 312 and the second dielectric 314 may include low-k dielectric materials, extra low-k dielectric materials, silicon nitride, silicon oxynitride or other applicable materials. In some embodiments, a dielectric constant of the second dielectric 314 is different from a dielectric constant of the first dielectric 312. In some embodiments, a dielectric constant of the second dielectric 314 is less than a dielectric constant of the first dielectric 312. In some embodiments, a dielectric constant of the second dielectric 314 is greater than a dielectric constant of the first dielectric 312.

In some embodiments, the semiconductor structure 200 further includes an active region 310. In some embodiments, the active region 310 is in proximity to the top surface of the semiconductive substrate 308. In some embodiments, the top surface of the active region 310 is coplanar with the top surface of the semiconductive substrate 308. In some embodiments, the active region 310 refers to a location where microelectronic elements are formed, and suitable microelectronic elements include, for example but not limited to, transistors, capacitors, diodes, inductors, and the like. In some embodiments, the semiconductive substrate 308 has multiple active regions and isolation regions (not shown) isolating the multiple active regions from each other. In various examples, the isolation regions include shallow trench isolation (STI) regions or local oxidation of silicon (LOCOS) regions.

Difference in areas of overlap of two conductors is a factor in the imbalance between capacitances. Because some conductors may be formed overlying or partly overlying the active region 310, while others may be not, the active region 310 may cause the imbalance between capacitances.

In some embodiments, the parasitic capacitor C1 includes a conductor composed of a plurality of conductive layers. In some embodiments, the conductor 304 is a multilayer structure. In some embodiments, the semiconductor structure 500 further includes an interconnecting layer 306.

In some embodiments, the interconnecting layer 306 is formed on the semiconductive substrate 308 and over the active region 310. In some embodiments, the interconnecting layer 306 is surrounded by and insulated by a dielectric 316. In some embodiments, the microelectronic elements in the active region 310 may be interconnected by, or may function with, the interconnecting layer 306 to form integrated circuit devices such as rectifiers, logic devices, or memory devices.

In some embodiments, the interconnecting layer 306 is connected to the conductor 304 through a via 220. Therefore, the interconnecting layer 306, the conductor 304, and the via 220 form an integral electrode.

In some embodiments, the integral electrode, the active region 310, and the dielectric 312 together form the parasitic capacitor C1. Meanwhile, the parasitic capacitor C2 is formed of the conductor 302, the semiconductive substrate 308, and the dielectric 312. The different configurations of the integral electrode and the conductor 302 may also cause an imbalance between capacitances.

In some embodiments, the via 220 is surrounded by and insulated by a dielectric 318. In some embodiments, the interconnecting layer 306 is connected to the conductor 304 through a contact plug, instead of a via.

In some embodiments, there are three dielectric layers (312, 316 and 318) in the parasitic capacitor C2, while there is only one dielectric layer (312) in the parasitic capacitor C1, which is also a factor in the imbalance between capacitances.

The numbers and arrangements of the conductors and the dielectrics in the figures are merely illustrated as examples for explanation, and the present disclosure is not limited thereto. Other kinds of structures may also suffer problems due to unbalanced capacitances.

In some embodiments, the top surface of the conductor 304 is free of coverage by the second dielectric 314. In some embodiments, several conductive elements are formed on the conductor 304, and several conductive elements are also formed on the conductor 302, such as the structure shown in FIG. 7B.

Subsequent processing may further include forming various contacts/vias/lines and multilayer interconnect features (e.g., metal layers and interlayer dielectrics) over the semiconductive substrate 308, configured to connect the various features or structures of the integrated circuit device. The additional features may provide electrical interconnection to the semiconductor device 500. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper-related multilayer interconnection structure.

Returning to FIG. 2, in some embodiments, the method further includes operation 202, determining net parasitic capacitances of the parasitic capacitor C1 and the parasitic capacitor C2. In some embodiments, the method 200 also includes operation 204, determining a voltage difference between conductors.

In some embodiments, the method 200 also includes operation 212, checking other requirements for specific structures. In some embodiments, the method 200 also includes operation 216, revising the layout data.

As mentioned above, to avoid the imbalance between capacitances, the dielectric constant of the dielectric medium, the thickness of the dielectric medium, and the area of overlap between the conductors may be taken into consideration.

For example, in a circumstance where the semiconductor structure 500 is to be used as an antenna, the semiconductor structure 500 may undergo a checking operation as operation 212 to see if the antenna area meets specifications. In some embodiments, in operation 212, the method 200 includes determining an area of overlap between the conductor 304 and the semiconductive substrate 308. In some embodiments, in operation 216, the area of overlap is revised.

In some embodiments, in operation 214, if the area is not within an acceptable range, the method 200 proceeds to operation 216 to revise the area in the layout data. In some embodiments, an area (indicated as A1 in FIG. 3) of the conductor 302 may be revised according to the capacitances of the parasitic capacitors C1 and C3, so as to adjust the capacitance of the parasitic capacitor C2.

In some embodiments, the method 200 includes determining the dielectric constant of the the parasitic capacitor C1 in operation 212, such as the dielectric constant K1 of the first dielectric 312. In some embodiments, the dielectric constant K2 of the second dielectric 314 and the dielectric constant K1 of the first dielectric 312 may be revised in operation 216 so that the capacitances of the parasitic capacitors C1 and C3 are compatible.

In some embodiments, the minimum lateral spacing S may be revised in operation 216 according to the dielectric constant K1 of the first dielectric 312, the dielectric constant K2 of the second dielectric 314, or both.

For example, if the capacitance of the parasitic capacitor C1 is close to the maximum value in an acceptable range, for example due to a greater dielectric constant of the first dielectric 312, the designer may choose to move the conductor 302 closer to the conductor 304, so as to make the capacitance of the parasitic capacitor C3 high enough to be balanced with the capacitance of the parasitic capacitor C1.

In some embodiments, the operation 202, the operation 206, and the operation 212 can proceed in different sequences, such as through the following orders: 202-206-212, 206-202-212, 212-202-206, or 212-206-202. However, the sequence of the operations is not limited thereto. In some embodiments, the operation 202, the operation 206, and/or the operation 212 can proceed in parallel.

After operation 202, in operation 204, if a ratio of the net parasitic capacitances is not within a predetermined range, the method 200 proceeds to operation 210, adding a dummy capacitor C2'. After operation 206, in operation 208, if the voltage difference is not within a predetermined range, the method 200 also proceeds to operation 210, adding a dummy capacitor CT.

In some embodiments, the original parasitic capacitor C2 is replaced with the dummy capacitor CT. In some embodiments, compared to the parasitic capacitor C1 and the original parasitic capacitor C2, the parasitic capacitor C1 and the dummy capacitor CT are more compatible with each other. In some embodiments, the dummy capacitor CT has the same capacitance as the parasitic capacitor C1. In some embodiments, the dummy capacitor C2' is configured to minimize the capacitance difference. In some embodiments, the dummy capacitor CT is configured to minimize the voltage difference.

In some embodiments, the dummy capacitor C2' is added by revising the layout data. In some embodiments, the revised layout data represents the information for forming a semiconductor structure having the dummy capacitor C2' for minimizing the capacitance difference and/or the voltage difference.

After the operation 202, the operation 206, and the operation 212, the method 200 proceeds to operation 218, outputting the revised layout data. In some embodiments, the revised layout data may be outputted to a display, a printer, or a computer storage medium. In some embodiments, the revised layout data may be used by a mask generator for manufacturing a semiconductive substrate accordingly.

Figure 6:
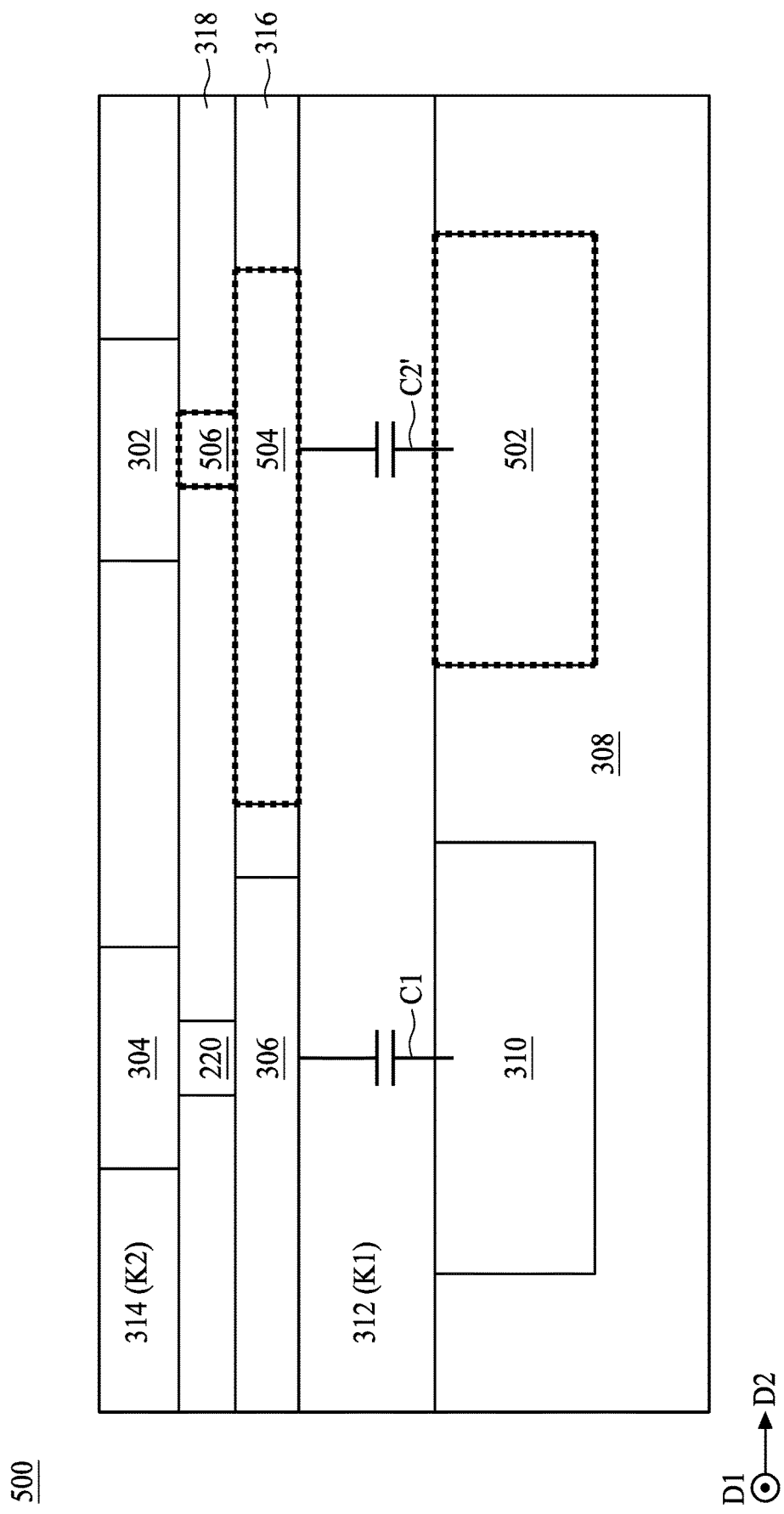

Referring to FIGS. 5 and 6, the semiconductor structure 500 in FIGS. 5 and 6 further includes a dummy capacitor, which is composed of the conductor 302, a via 506, an interconnect layer 504, and an active region 502. The via 506, the interconnect layer 504, and the active region 502 are additionally formed to create a parasitic capacitor CT. Compared to the parasitic capacitor C1 and the original parasitic capacitor C2 in FIGS. 3 and 4, the parasitic capacitor C1 and the parasitic capacitor CT in FIGS. 5 and 6 are more compatible with each other.

In some embodiments, the dummy capacitance of the parasitic capacitor CT can be introduced without process changes. For example, in some embodiments, the layout data is revised so that the parasitic capacitor C1 and the parasitic capacitor CT can be formed in a same operation. In some embodiments, the active regions 310 and 502 can be formed in a same operation. In some embodiments, the interconnect layers 306 and 504 can be formed in a same operation. In some embodiments, the vias 220 and 506 can be formed in a same operation.

In some embodiments, the dummy capacitance of the capacitor CT can be further adjusted or modified according to capacitances of the parasitic capacitors C1 and C3 for meeting other requirements in accordance with the spirit of the present invention.

Figure 7A:
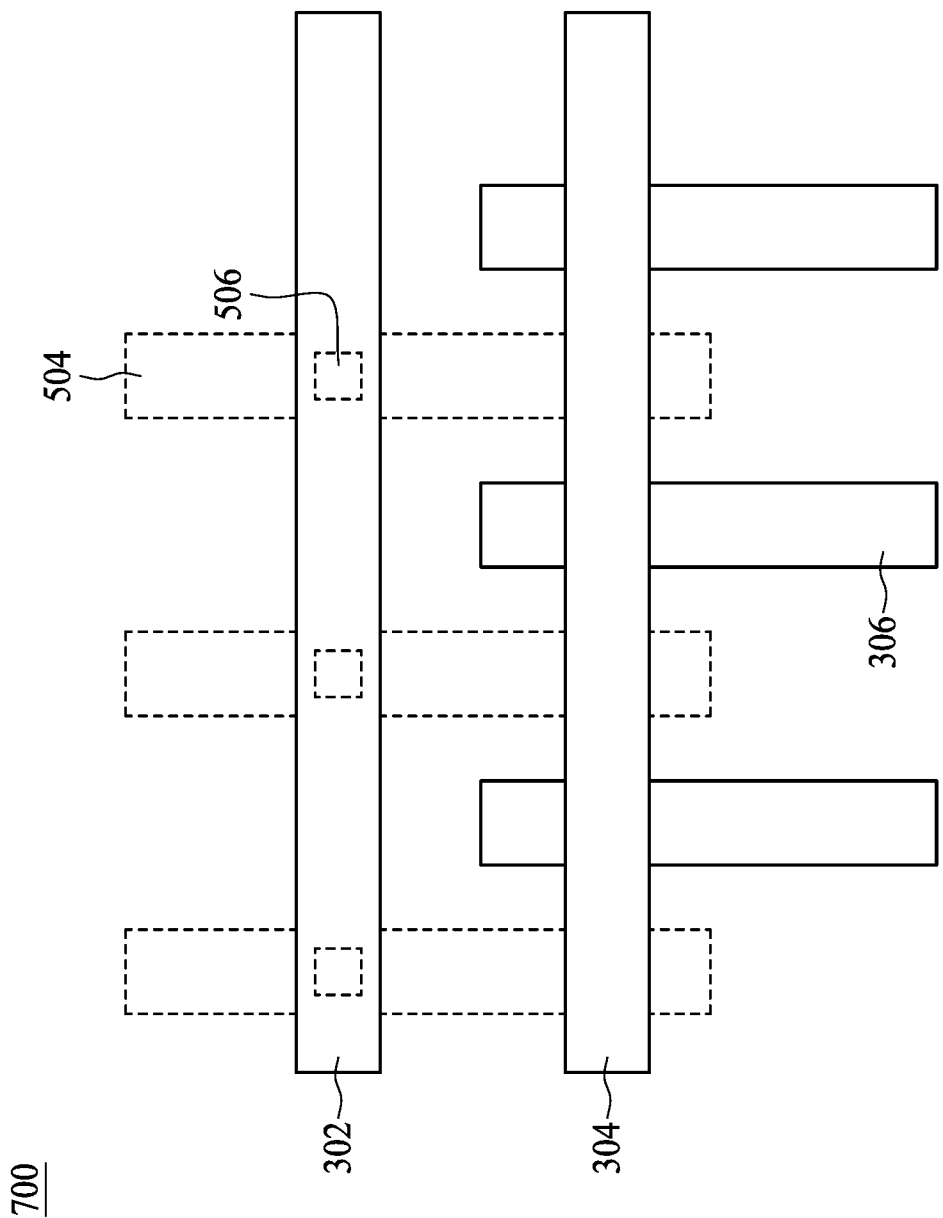
Figure 7B:
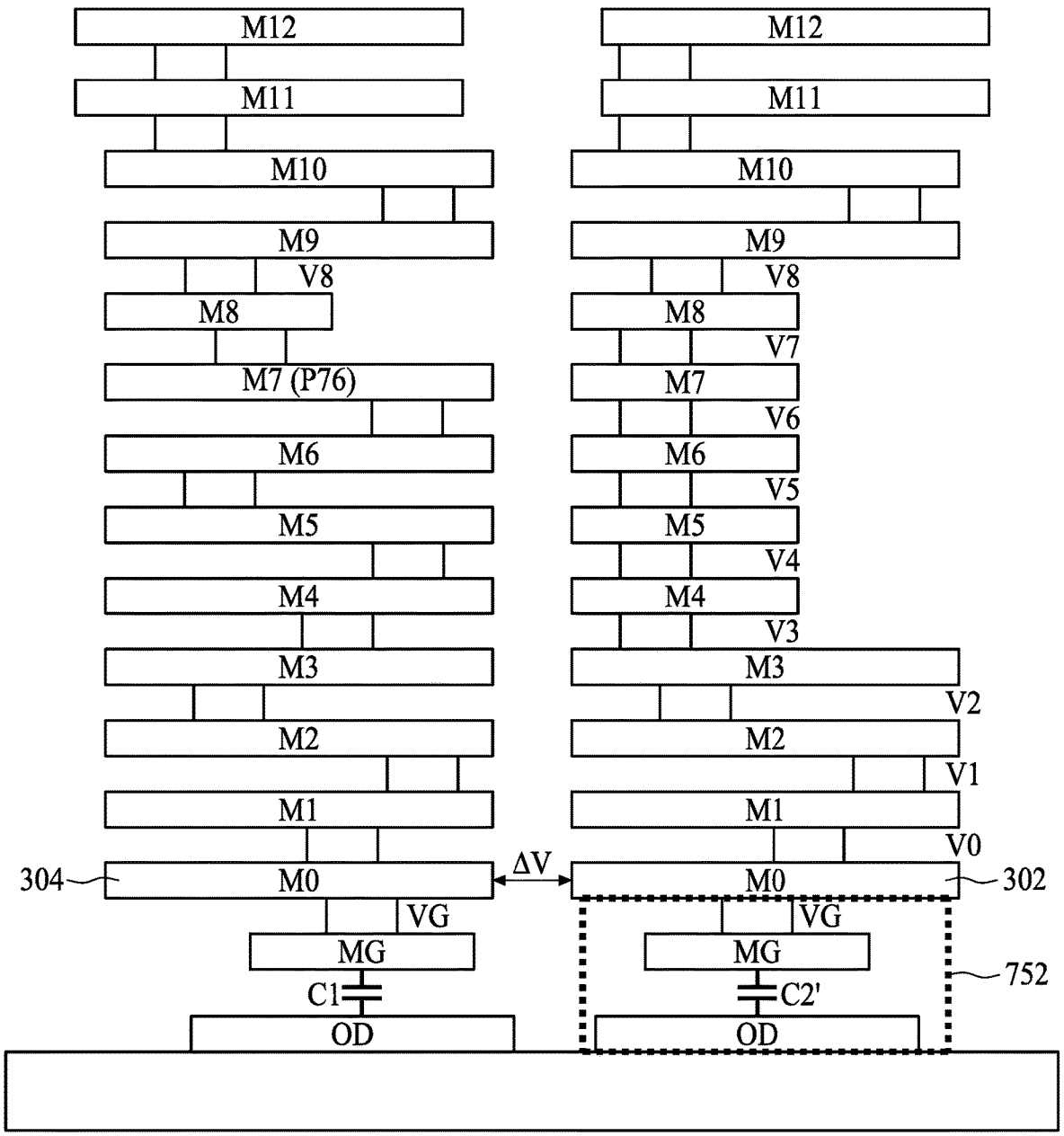

It should be noted that the quantity and arrangement of the dummy capacitors are illustrated merely as examples for explanation, and the present disclosure is not limited thereto. Referring to FIG. 7A, the semiconductor structure 700 is similar to the semiconductor structure 500 described above in relation to FIGS. 5 and 6. As shown in FIG. 7A, multiple interconnect layers 504 and multiple vias 506 may be formed to create dummy capacitors, and therefore, more than one capacitor CT may be introduced. Referring to FIG. 7B, the semiconductor structure 750 is similar to the semiconductor structure 500 described above in relation to FIGS. 5 and 6. The semiconductor structure 750 further includes several conductive elements formed on the conductor 304 and the conductor 302. A dummy capacitor 752 is added in the semiconductor structure 750 according to the method 200.

The method 200 may be applied in some particular semiconductor structures to reduce or mitigate the problem of unbalanced capacitances. For example, a semiconductor structure with a gate electrode (further discussed with reference to FIG. 8), a semiconductor structure with a source/drain conductor (further discussed with reference to FIG. 9), and a semiconductor structure with a fin and a gate electrode (further discussed with reference to FIG. 10) are described below. Although the above particular semiconductor structures are discussed, the present disclosure is not limited thereto, and can be applied in manufacturing any other semiconductor structures.

Because the semiconductor structures 800, 900, and 950 are similar to the semiconductor structure 500 described above, the identical numbers represent similar components for simplicity of explanation. Descriptions of such similar components are omitted in the interest of brevity, and only the differences are discussed.

Figure 8:
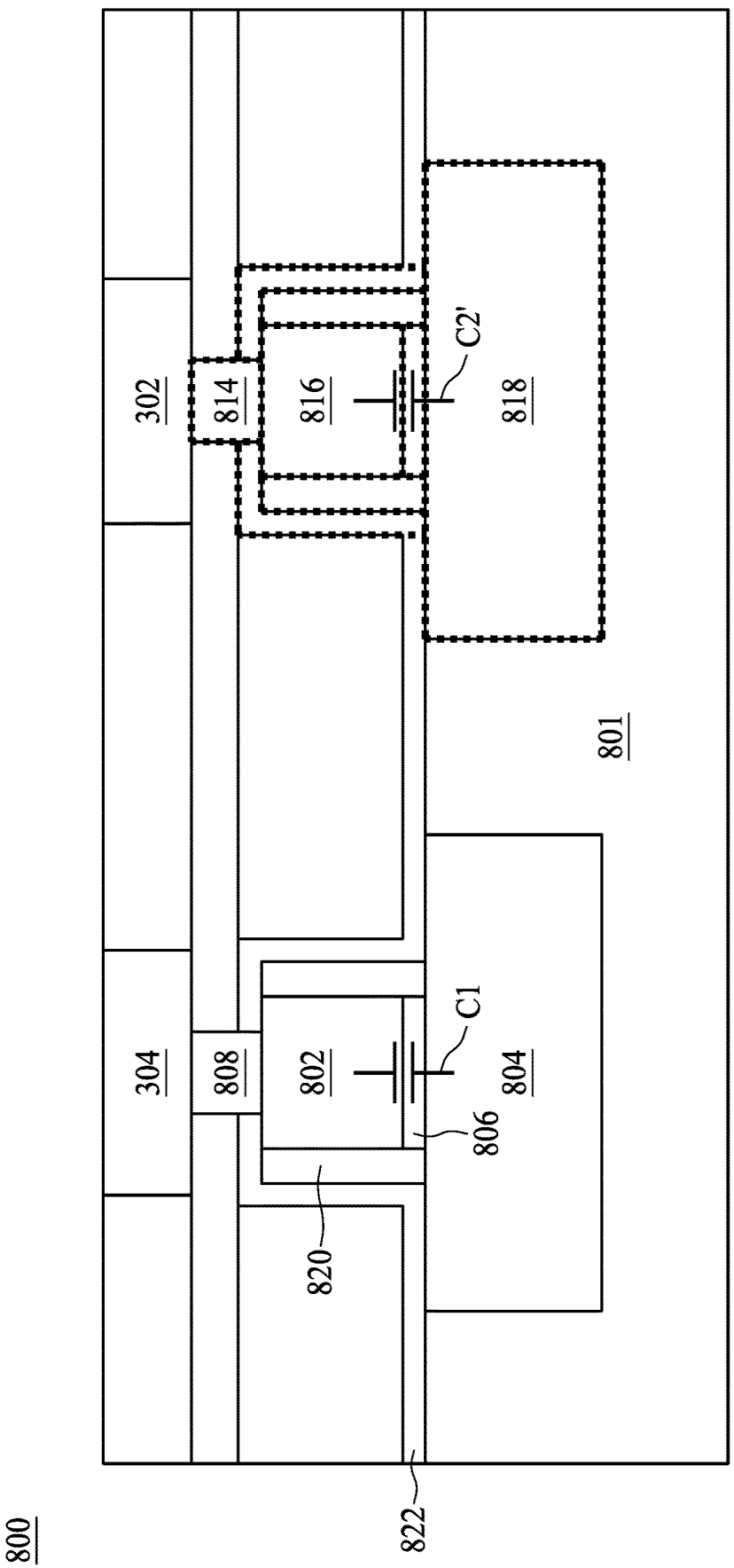

Referring to FIG. 8, FIG. 8 is cross-sectional view of a semiconductor structure 800, in accordance with some embodiments of the present disclosure. The semiconductor structure 800 includes a semiconductive substrate 801 with a gate electrode 802 formed over an area 804 of the semiconductive substrate 801.

In some embodiments, the area 804 may be a well region, or another type of active region. Therefore, a gate dielectric 806, the gate electrode 802, and the area 804 constitute a parasitic capacitor C1. In some embodiments, the semiconductor structure 800 further includes a conductor 810 and a via 808, which form an integral electrode of the parasitic capacitor C1 with the gate electrode 802.

In some embodiments, the area 804 may be an STI region. Therefore, the area 804 and the gate dielectric 806 form an integral dielectric of the parasitic capacitor C1. The semiconductive substrate 801 and the gate electrode 802 are two conductors of the parasitic capacitor C1.

According to the method 200 described with reference to FIG. 2, if a ratio of the net parasitic capacitances of the parasitic capacitor C1 and the parasitic capacitor C2 is not within a predetermined range, or if the difference between voltages of the conductors 810 and 812 is not within a predetermined range, the layout data may be revised so that a dummy capacitor C2' may be formed in the semiconductive substrate 801.

In some embodiments, an area 818 of the dummy capacitor C2' is formed in the same operation as the area 804. In some embodiments, a gate electrode 816 of the dummy capacitor CT is formed in the same operation as the gate electrode 802. In some embodiments, a via 814 of the dummy capacitor CT is formed in the same operation as the via 808. In some embodiments, a conductor 812 of the dummy capacitor CT is formed in the same operation as the conductor 810.

In some embodiments, a pair of sidewall spacers 820 is formed on two sides of the gate electrode 802. In some embodiments, the semiconductor structure 800 further includes a contact etch stop layer (CESL) 822. Referring to FIG. 8, the CESL 822 is blanket formed over the gate electrode 802 and the gate electrode 816.

Figure 9:
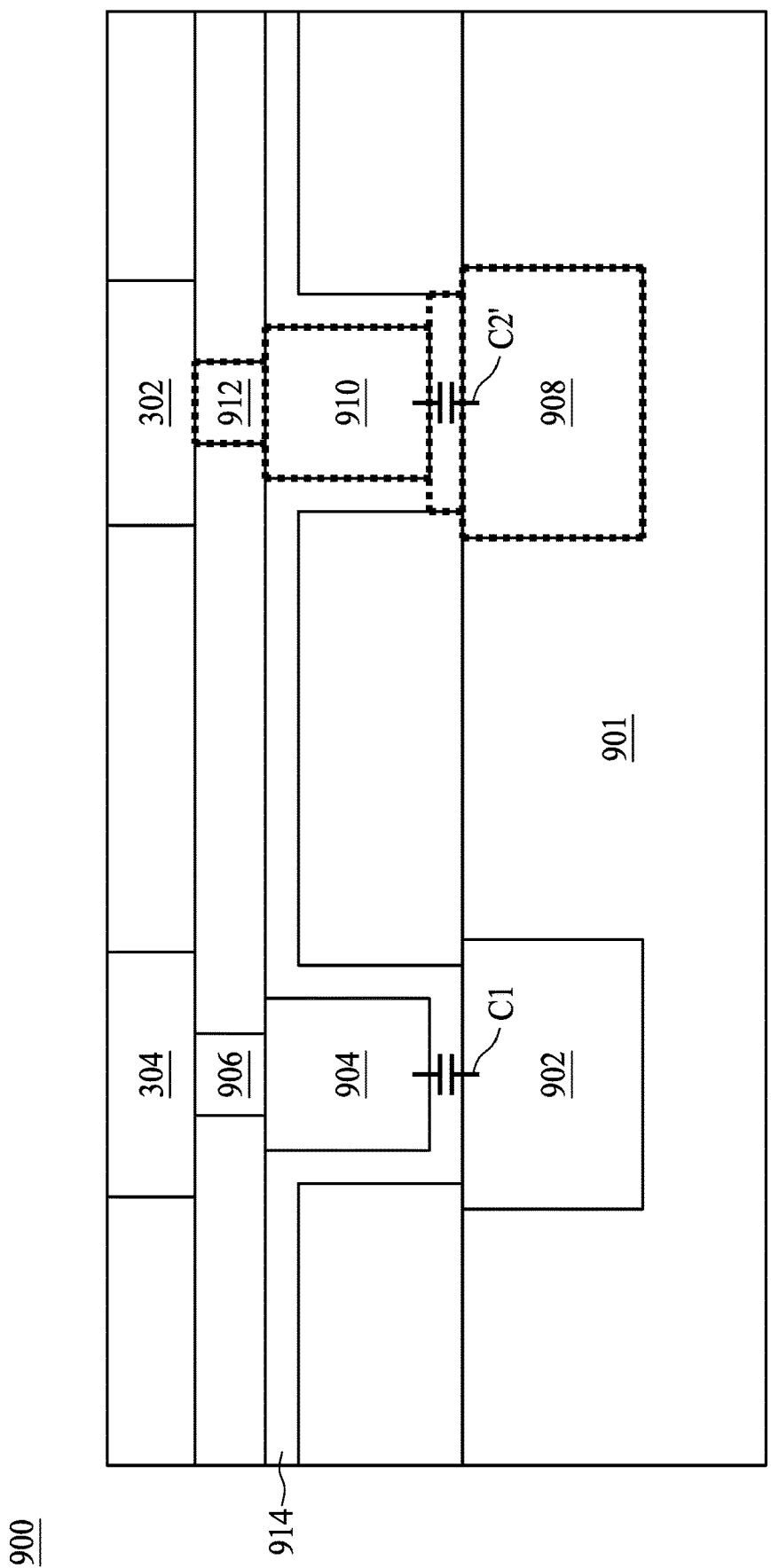

Referring to FIG. 9, FIG. 9 is a cross-sectional view of a semiconductor structure 900, in accordance with some embodiments of the present disclosure. In some embodiments, the semiconductor structure 900 includes a semiconductive substrate 901, an STI region 902, and a source/drain region 904. In some embodiments, the semiconductive substrate 901, the STI region 902, and the source/drain region 904 form the parasitic capacitor C1.

In some embodiments, the semiconductor structure 900 further includes a contact plug 906 connecting the source/drain region 904 to the conductor 204. According to the method 200 described with reference to FIG. 2, an STI region 908, a source/drain region 910, and a contact plug 912 may be formed by revising the layout data to introduce the dummy capacitor CT in the semiconductor structure 900. In some embodiments, the semiconductor structure 900 further includes a CESL 914. Referring to FIG. 9, the CESL 914 is blanket formed over the STI region 902 and the STI region 908.

Figure 10:
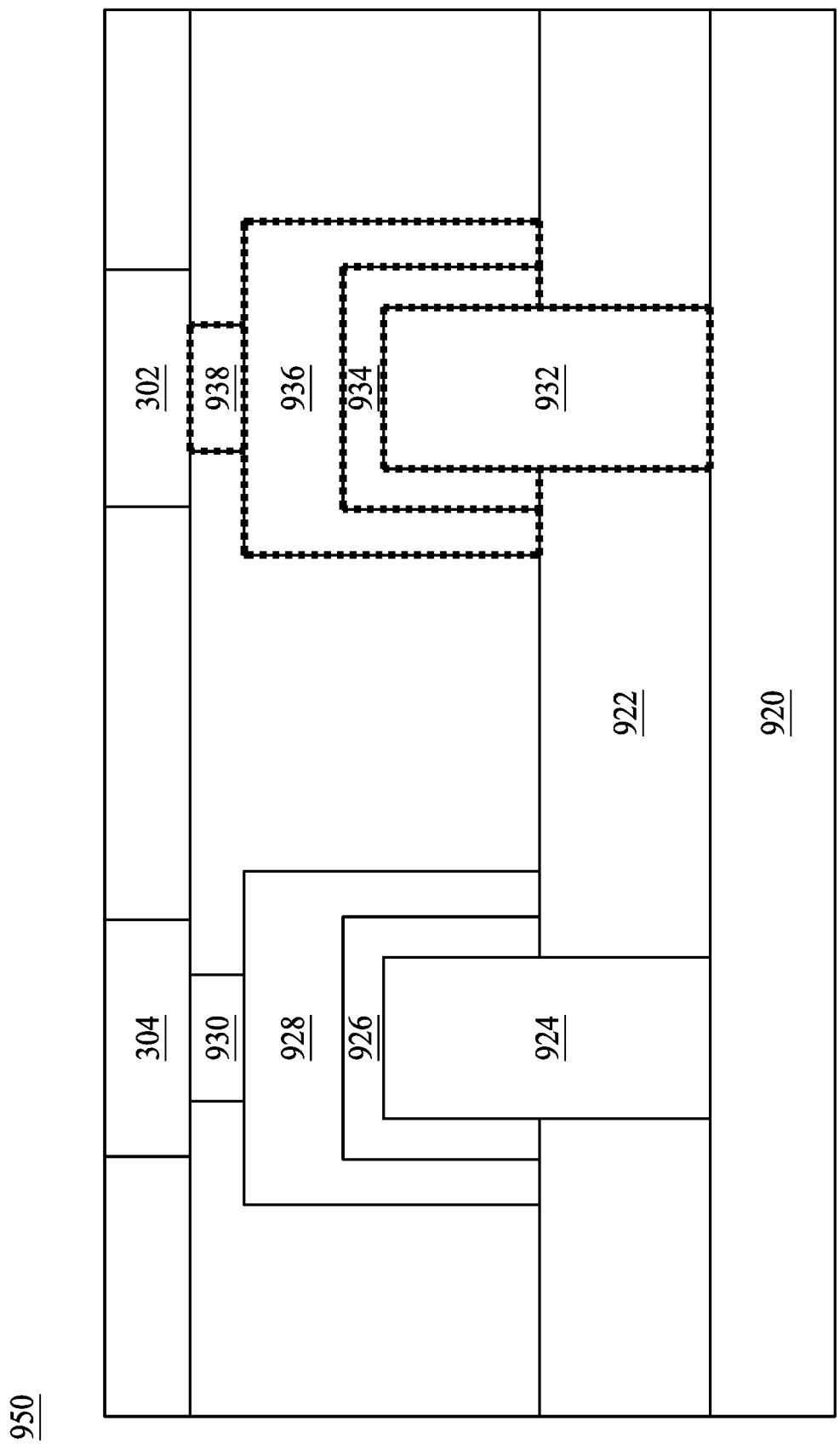

Referring to FIG. 10, FIG. 10 is a cross-sectional view of a semiconductor structure 950, in accordance with some embodiments of the present disclosure. In some embodiments, the semiconductor structure 950 includes a semiconductive substrate 920, an STI region 922, and a fin 924. In some embodiments, the semiconductor structure 950 further includes a gate electrode 928 provided over (and sometimes wraps around) the fin 924 and a gate dielectric 926 between the gate electrode 928 and the fin 924.

In some embodiments, the fin 924, the gate dielectric 926, and the gate electrode 928 form the parasitic capacitor C1. In some embodiments, the semiconductor structure 950 further includes a via 930 connected between the gate electrode 928 and the conductor 204.

According to the method 200 described with reference to FIG. 2, a fin 932, a gate dielectric 934, a gate electrode 936, and a via 938 may be formed by revising the layout data to introduce the dummy capacitor CT in the semiconductor structure 950.

Some embodiments of the present disclosure provide a method for manufacturing a semiconductor device. The method includes receiving layout data representing mask information for manufacturing a semiconductive substrate with a conductor over the semiconductive substrate. A first capacitor is formed between the conductor and the semiconductive substrate. The method further includes determining a difference in capacitances of the first capacitor and a neighboring capacitor. The method further includes forming a dummy capacitor to minimize the capacitance difference.

Some embodiments of the present disclosure provide a method for manufacturing a semiconductor device. The method includes receiving layout data representing information for manufacturing a semiconductive substrate with a first conductor and a second conductor. The method further includes determining a difference between voltages of the first conductor and the second conductor. The method further includes forming a dummy capacitor to minimize the voltage difference.

Some embodiments of the present disclosure provide a system for manufacturing a semiconductor device. The system includes a computer readable storage medium and a processor coupled to the computer readable storage medium. The computer readable storage medium contains layout data representing mask information for manufacturing a semiconductive substrate with a conductor over the semiconductive substrate. A first capacitor is formed between the conductor and the semiconductive substrate. The processor is programmed for determining a difference in capacitances of the first capacitor and a neighboring capacitor. The processor is further programmed for forming a dummy capacitor to minimize the capacitance difference. The processor is further programmed for outputting a representation of the layout data to an output device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods, or steps.

What is claimed is:

1. A method for manufacturing a semiconductor device, the method comprising:
   receiving layout data representing mask information for manufacturing a semiconductive substrate with a conductor over the semiconductive substrate, wherein a first capacitor is formed between the conductor and the semiconductive substrate;
   determining a capacitance difference between capacitances of the first capacitor and a neighboring capacitor; and
   forming a dummy capacitor to minimize the capacitance difference.

2. The method of claim 1, wherein the forming the dummy capacitor comprises:
replacing the neighboring capacitor with the dummy capacitor having a same capacitance as the first capacitor.

3. The method of claim 1, further comprising:
determining a voltage difference between voltages of the conductor and a neighboring conductive feature.

4. The method of claim 3, further comprising:
determining a dielectric constant of a first dielectric formed between the conductor and the semiconductive substrate; and
defining a minimum lateral spacing between the conductor and the neighboring conductive feature.

5. The method of claim 1, further comprising:
determining an area of overlap between the conductor and the semiconductive substrate; and
revising the area of overlap.

6. The method of claim 1, wherein the conductor is a first gate electrode, and the forming the dummy capacitor comprises:
forming a second gate electrode and the first gate electrode in a same operation.

7. A method for manufacturing a semiconductor device, the method comprising:
receiving layout data representing information for manufacturing a semiconductive substrate with a first conductor and a second conductor;
determining a voltage difference between voltages of the first conductor and the second conductor; and
forming a dummy capacitor to minimize the voltage difference.

8. The method of claim 7, wherein the information comprises a set of photolithography masks for manufacturing the semiconductor device.

9. The method of claim 7, wherein the first conductor is a first gate electrode, and the method further comprises:
outputting the received layout data representing the information for forming a second gate electrode and the first gate electrode in a same operation.

10. The method of claim 7, wherein the first conductor is over a first active region of the semiconductive substrate, and the method further comprises:
outputting the received layout data representing the information for forming a second active region and the first active region in a same operation.

11. The method of claim 7, wherein the first conductor is a first contact plug, and the method further comprises:
outputting the received layout data representing the informations for forming a second contact plug and the first contact plug in a same operation.

12. The method of claim 7, wherein the method further comprises:
determining an area of overlap between the first conductor and the semiconductive substrate; and
revising the layout data by adjusting the area of overlap.

13. A system for manufacturing a semiconductor device, the system comprising:
a non-transitory computer readable storage medium containing layout data representing mask information for manufacturing a semiconductive substrate with a conductor over the semiconductive substrate, wherein a first capacitor is formed between the conductor and the semiconductive substrate; and
a processor coupled to the non-transitory computer readable storage medium and programmed for:
determining a capacitance difference between capacitances of the first capacitor and a neighboring capacitor;
forming a dummy capacitor to minimize the capacitance difference; and
outputting a representation of the layout data to an output device.

14. The system of claim 13, wherein the processor is further programmed for:
replacing the neighboring capacitor with the dummy capacitor having a same capacitance as the first capacitor in response to the capacitance difference.

15. The system of claim 13, wherein the processor is further programmed for:
determining a voltage difference between voltages of the conductor and a neighboring conductive feature.

16. The system of claim 15, wherein the processor is further programmed for:
determining a dielectric constant of a first dielectric formed between the conductor and the semiconductive substrate; and
defining a minimum lateral spacing between the conductor and the neighboring conductive feature.

17. The system of claim 13, wherein the processor is further programmed for:
determining an area of overlap between the conductor and the semiconductive substrate; and
revising the area of overlap.

18. The system of claim 13, wherein the conductor is a first gate electrode, and wherein the processor is further programmed for:
revising the layout data by forming a second gate electrode and the first gate electrode in a same operation.

19. The system of claim 13, wherein the conductor is over a first active region, and wherein the processor is further programmed for:
revising the layout data by outputting the layout data representing the information for forming a second active region and the first active region in a same operation.

20. The system of claim 13, wherein the conductor is a first contact plug, and wherein the processor is further programmed for:
revising the layout data by outputting the layout data representing the information for forming a second contact plug and the first contact plug in a same operation.

* * * * *